United States Patent
Avanzino et al.

(10) Patent No.: US 6,184,141 B1
(45) Date of Patent: Feb. 6, 2001

(54) METHOD FOR MULTIPLE PHASE POLISHING OF A CONDUCTIVE LAYER IN A SEMIDONDUCTOR WAFER

(75) Inventors: Steven C. Avanzino, Cupertino; Kashmir S. Sahota, Fremont, both of CA (US); Gerd Marxsen, Austin, TX (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/198,369

(22) Filed: Nov. 24, 1998

(51) Int. Cl.$^7$ .................................................. H01L 21/00
(52) U.S. Cl. ............................................ 438/692; 438/693
(58) Field of Search ............................ 438/692, 693, 438/959

(56) References Cited

U.S. PATENT DOCUMENTS

| | | |
|---|---|---|
| 5,225,034 | 7/1993 | Yu et al. . |
| 5,391,517 | 2/1995 | Gelatos et al. . |
| 5,618,381 | 4/1997 | Doan et al. . |
| 5,723,387 * | 3/1998 | Chen ..................................... 438/692 |
| 5,762,544 | 6/1998 | Zuniga et al. . |
| 5,780,358 | 7/1998 | Zhou et al. . |
| 5,913,712 * | 6/1999 | Molinar .................................. 451/41 |
| 5,942,449 * | 8/1999 | Meikle ................................. 438/747 |
| 5,956,612 * | 9/1999 | Elliot et al. ........................... 438/637 |

* cited by examiner

Primary Examiner—Benjamin L. Utech
Assistant Examiner—Matt Anderson

(57) ABSTRACT

A method of planarizing a copper containing conductive layer of a semiconductor wafer forms a blanketing copper containing layer within and upon a patterned substrate layer. Chemical mechanical polish (CMP) planarizing is performed on the copper containing layer at a relatively fast rate of removal until most of the layer is removed. The remaining portion of the layer is then CMP planarized at a second rate of removal, which is slower than the first rate of removal, until the copper containing layer is substantially completely removed and a barrier layer underlying the copper containing layer is reached. The multiple phase planarization of the copper containing layer avoids excessive dishing and pattern erosion while maintaining high throughput and uniform removal.

28 Claims, 3 Drawing Sheets

METHOD FOR MULTIPLE PHASE POLISHING OF A CONDUCTIVE LAYER IN A SEMIDONDUCTOR WAFER

FIELD OF THE INVENTION

The present invention relates to the formation of metal interconnection layers during the manufacture of semiconductor devices, and more particularly to the polishing of a conductive layer of a semiconductor wafer in order to planarize the conductive layer.

BACKGROUND OF THE INVENTION

The escalating requirements for high-denisity and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layer and conductive patterns. An integrated circuit is formed containing a plurality of conductive patterns, and a plurality of interconnect lines, such as bus lines, bit-lines, and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed on a substrate layer or in trenches and typically extend substantially horizontal with respect to the semiconductor substrate. Semiconductor "chips" comprising five or more levels of metallization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or a via hole section in communication with an upper trench section, which opening is filled with a conductive material, typically a metal, to simultaneously form a conductive plug and electrical contact with a conductive line.

High performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and, hence, the circuit speed. As integration density increases and feature size decreases in accordance with deep sub-micron design rules, e.g., a design rule of about 0.18 $\mu$m and below, the rejection rate due to integrated circuit speed delays severely limits production throughput and significantly increases manufacturing costs.

In prior technologies, aluminum was used in very large scale integration interconnect metallization. Copper and copper alloys have received considerable attention as a candidate for replacing aluminum in these metallizations. Copper has a lower resistivity than aluminum and improved electrical properties vis-à-vis tungsten, making copper a desirable metal for use as a conductive plug as well as conductive wiring.

In the planarization of a copper containing conductive layer to stop on a barrier layer, wide conductive lines tend to "dish" and dense patterns tend to erode. This causes unwanted copper line thinning which increases resistance in the interconnections. The dishing and pattern erosion is caused by the high pressure and speed process conditions conventionally used to planarize ("polish") copper. Relatively high pressure and high speed process conditions are employed to provide a desirable copper removal rate and a uniform removal of the conductive layer. This single phase polishing produces a structure, such as depicted in prior art FIG. 4, exhibiting dishing and pattern erosion.

In order to avoid dishing and pattern erosion, a slower polishing and lower pressure process could be employed, but this would undesirably reduce the throughput and may have an effect on the uniformity of removal of the copper conductive layer. Furthermore, a greater amount of overpolishing is required by poor removal uniformity in order to complete the planarization process.

An approach to minimize dishing is described in U.S. Pat. No. 5,618,381 that employs a multiple step method of chemical-mechanical polishing. In the described method, a protective layer of material, such as silicon dioxide, borophosphosilicate glass, silicon nitride or tetraorthosilicate is formed over the metal surface of the layer of conductive material to be planarized. The protective layer is not as easily polished as the metal in a CMP process of the protective layer from the underlying metal overburden. A second CMP process, which removes the metal at a greater rate than the protective layer, is said to prevent the polishing pad from dishing metal in the areas having larger metal features such as large metal buses and bond pads.

One of the significant disadvantages of the above approach is the additional steps taken to avoid the dishing effect. This includes the additional deposition steps employed to produce the protective layer of material on the metal. Also, it is possible for some of this material to remain on the wafer, possibly increasing the overall capacitance of the chip. The additional processing steps also have an adverse impact on wafer throughput.

There is a need for a method of planarizing a plated copper surface to remove most of the copper from the wafer surface using process conditions that produce a rapid, uniform removal of the copper for purposes for high throughput, while minimizing overpolishing necessitated by poor removal uniformity. The process needs to reduce the dishing and erosion that arises in conventional high speed and high pressure process conditions, while still maintaining acceptable throughput and uniformity.

SUMMARY OF THE INVENTION

These and other needs are met by the present invention which provides a method of polishing a conductive layer on underlying layer of a semiconductor wafer. In this method, a conductive layer is polished at a first rate of removal until a first amount of the conductive layer is removed. The conductive layer is then polished at a second rate of removal, which is slower than the first rate, until a second amount of the conductive layer is removed.

A method of polishing the conductive layer in accordance with the present invention at first and second rates of removal allows a high rate of removal to be employed to remove the bulk of the conducting (e.g. copper) film so that adequate throughput and uniformity may be maintained. The second phase of the polishing process, in which the conductive layer is removed at a second rate of removal that is slower than the first rate, avoids the dishing that occurs when the polishing is performed at a single rate of removal after a barrier layer is exposed during, overpolishing. However, the throughput and uniformity is not greatly compromised since the polishing of the conductive layer at the slower, second rate of removal is performed only after the bulk of the copper film is removed. Furthermore, since the multiple phases of polishing are applied to the conductive layer itself, a protective layer is not used. This avoids the additional deposition steps and polish steps required to provide and remove a protective layer over a conductive layer suggested by the prior art.

The earlier stated needs are met by another aspect of the present invention which provides a method of planarizing a copper containing conductive layer of a semiconductor wafer, the method comprising the steps of patterning a substrate layer and forming within and upon the patterned substrate layer a blanketing copper containing layer. This copper containing layer is chemical mechanical polish (CMP) planarized at a first rate of removal until it is reduced to approximately a first desired thickness above the substrate layer. The copper containing conductive layer is then CMP planarized at a second rate of removal, slower than the first rate of removal, until the copper containing conductive layer is reduced to approximately a second desired thickness above the substrate layer.

Additional advantages of the present invention will become readily apparent to those skilled in the art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE INVENTION

The present invention solves problems associated with planarization of a copper containing conductive layer to stop on a barrier layer in the metal interconnect region of a semiconductor wafer. Specifically, the present invention employs a multiple phase (or step) polishing of the copper conductive layer so that the bulk of the conductive layer is removed at a high rate of removal. This provides good throughput and uniformity for removal, and surface planarity at this interim step. In order to avoid the dishing and pattern erosion that normally occurs after the barrier reached at high rates of copper removal, the conductive layer is then polished at a second rate of removal, slower than the first rate, until the remainder of the copper conductive layer is removed and the barrier layer is reached. The removal rates are changed, in certain embodiments, by changing the pressure applied against the path by the wafer and/or the rotational speed of the polishing pad.

Figure 1:
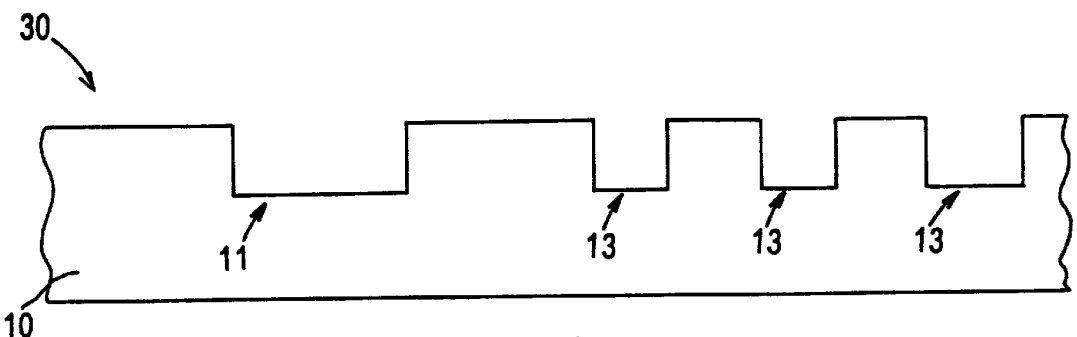
FIG. 1 is a cross-section of a patterned substrate layer of a semiconductor wafer to be processed in accordance with embodiments of the present invention.

FIG. 1 depicts a cross-section of a portion of a semiconductor wafer 30. The depicted portion of the wafer 30 includes a patterned substrate layer 10 comprising a dielectric material, such as silicon dioxide, for example. The substrate layer 10 has been patterned in this example with a relatively wide trench 11 and relatively narrower features 13. This pattern is exemplary only, as other patterns may be employed within the substrate layer 10, as well known to those of ordinary skill in the art.

Figure 2:
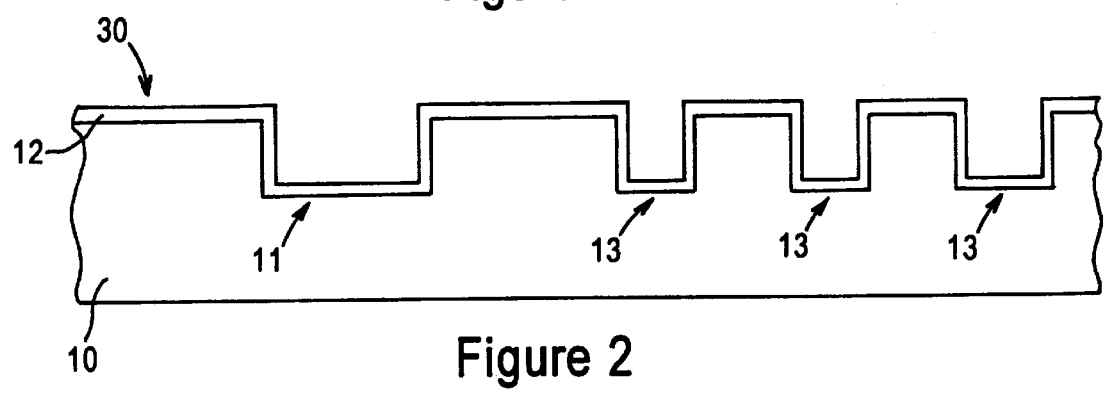
FIG. 2 is a cross-section of the portion of FIG. 1 after a barrier layer has been deposited over the substrate layer.

When copper is utilized in a metallization scheme, a diffusion barrier layer is normally employed in order to prevent diffusion of the copper into the dielectric layer. Although certain materials, such as benzocyclobutene (BCB), form a self diffusion barrier, in the exemplary embodiment depicted in FIG. 2, a barrier layer 12, such as tantalum nitride, has been deposited on the dielectric layer 10. The barrier layer 12 is formed on the top surface of the dielectric layer 10, as well as within the trenches 11 and features 13. Tantalum nitride should be considered exemplary only, as other materials for diffusion barrier layer 12 may be employed without departing, from the scope of the invention.

Figure 3:
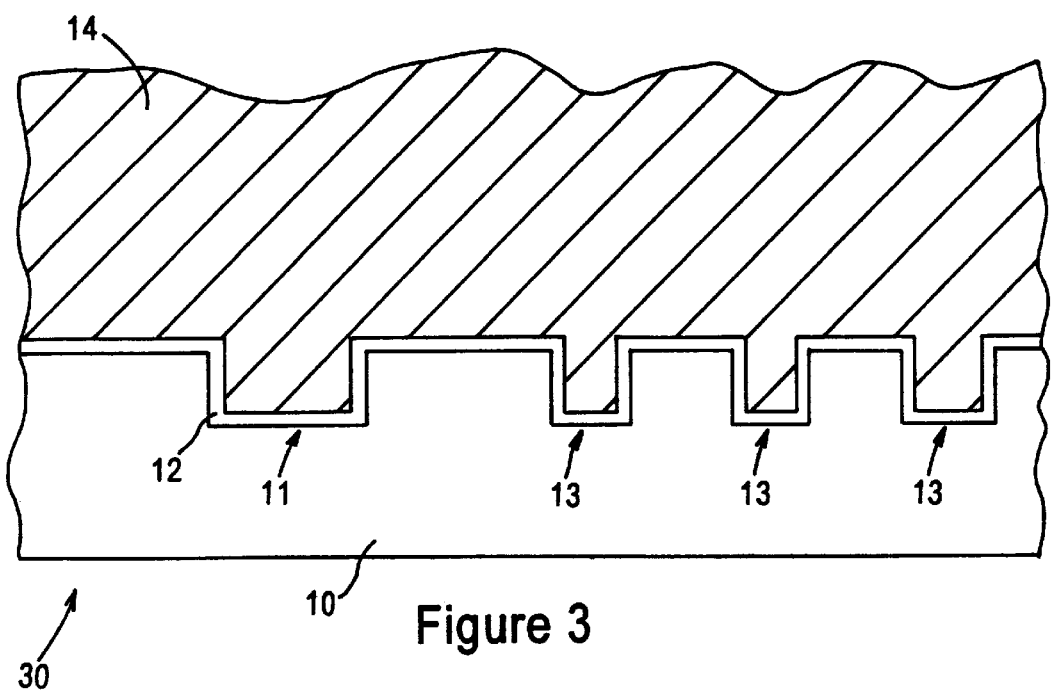
FIG. 3 is a cross-section of the portion of FIG. 2 after a copper containing conductive layer is blanket deposited over the barrier layer.

The conductive layer 14 is then blanket deposited, as seen in FIG. 3, over the barrier layer 12 and dielectric layer 10. The conductive layer 14, which is a copper containing conductive layer in preferred embodiments of the present invention, completely fills the trenches 11 and features 13 formed in the patterned substrate layer 10. Copper containing conductive layer 14 also covers the barrier layer 12 that is present on the top surface of the substrate layer 10. Copper is deposited in a conventional manner, such as by chemical vapor deposition (CVD) techniques.

A typical thickness of a substrate layer 10 is 10,000 Å, a barrier layer of tantalum nitride is 300 Å, and a copper containing conductive layer is approximately 10,000 Å.

Figure 7:
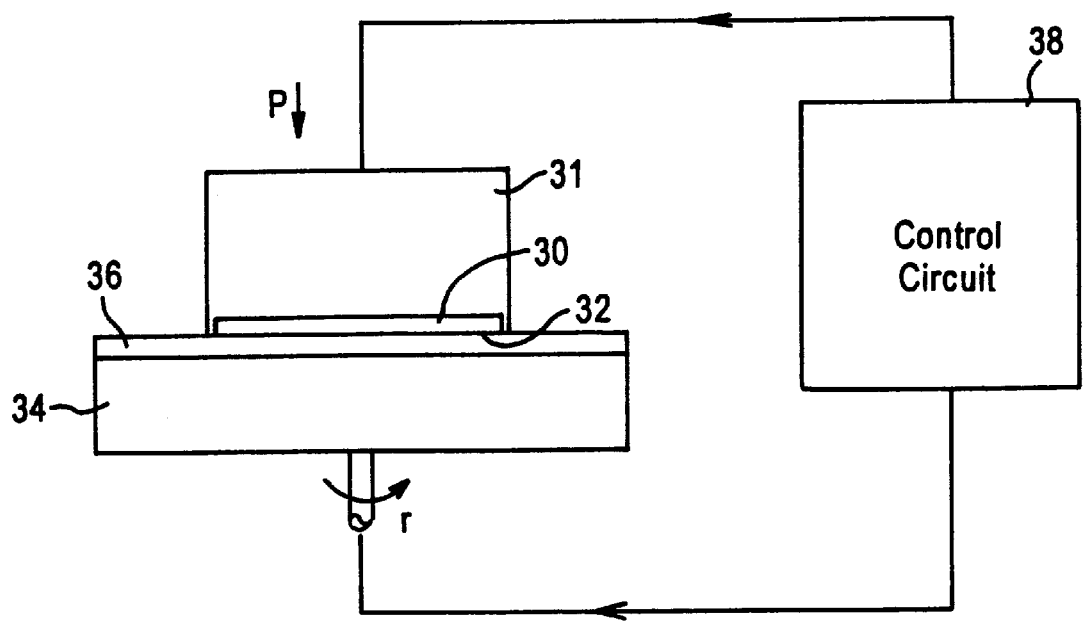
FIG. 7 is a schematic depiction of a CMP planarization apparatus operable to planarize the copper containing conductive layer with multiple rates of removal in accordance with embodiments of the present invention.

In conventional CMP planarization, a reactive agent in a slurry reacts with the surface of the layer to be polished, and the abrasive particles mechanically remove the reacted surface layer. The interaction of the polishing pad, abrasive particles, and reactive agent with the layer to be polished results in a polishing. Typically, as depicted in FIG. 7, a wafer 30 is held by a rotatable carrier head 31 with the top surface 32 (the surface to be polished) of the wafer 30 pressed face down against the outer surface of a polishing pad 36. A rotatable platen 34 carriers the polishing pad 36. A common two-layer polishing pad, with the upper layer composed of IC-1000 and the lower layer composed of SUBA-4, is available from Rodel, Inc. located Newark, Del. (IC-1000 and SUBA-4 are product names of Rodel, Inc.). The polishing pad 36 is normally attached to the platen 34 by a pressure-sensitive adhesive layer.

The pressure applied by the carrier head 31 to press the wafer 30 against the polishing pad 36 is variable to a desired pressure. The speeds of the motors (not shown) that rotate the platen 34 and the carrier head 31 may also be set to desired speeds. Both the speeds and the pressure may be controlled by a suitable control 38, known to those of skill in the art. For example, U.S. Pat. No. 5,762,544 discloses a carrier head 180 for application of a force of approximately 4 to 10 pounds per square inch to a substrate for a main polishing step, and about 3 psi for a final polishing step at a different station.

Figure 4:
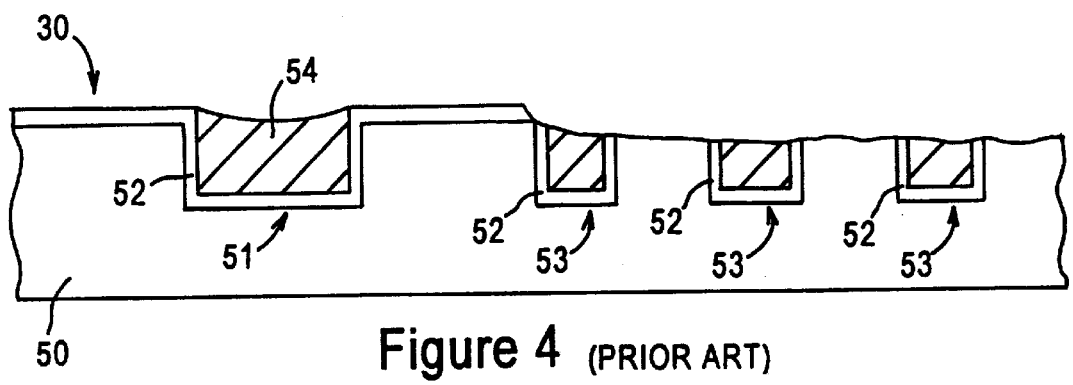
FIG. 4 is a cross-section of the portion of FIG. 3 after planarization in accordance with a prior art method of CMP planarization.

In the representation of FIG. 4, a cross-section of a semiconductor wafer processed in accordance with the prior art is depicted. The main polishing step, performed with a single set rate of removal, causes dishing and pattern erosion. This polishing step has been performed after the deposition of the copper conductive layer as depicted in FIG. 3. For example, a normal pressure that is applied by the carrier head 31 to the wafer 30 is 4 psi. The rotational speed of the platen 34, which also affects the rate of removal of the layer 14, is approximately 150 rpm. This level of pressure and rotational speed provides a rapid rate of removal of the copper conductive layer 14, which desirably maintains a high throughput and satisfactory uniformity of removal. However, as shown in FIG. 4, the trench 51 and the features 53 that all contain copper 54, are subject to dishing and pattern erosion. Hence, after the barrier layer 52 over the substrate 50 is exposed during overpolishing, dishing and pattern erosion effects occur due to the moderate pressures on the wafer and fast polish platen speeds. The present invention substantially avoids dishing and pattern erosion produced by the polishing in accordance with the prior art, by instead employing a multiple phase polishing of the copper containing conductive layer 14. This can be carried out at the same polishing station to increase throughput.

Figure 5:
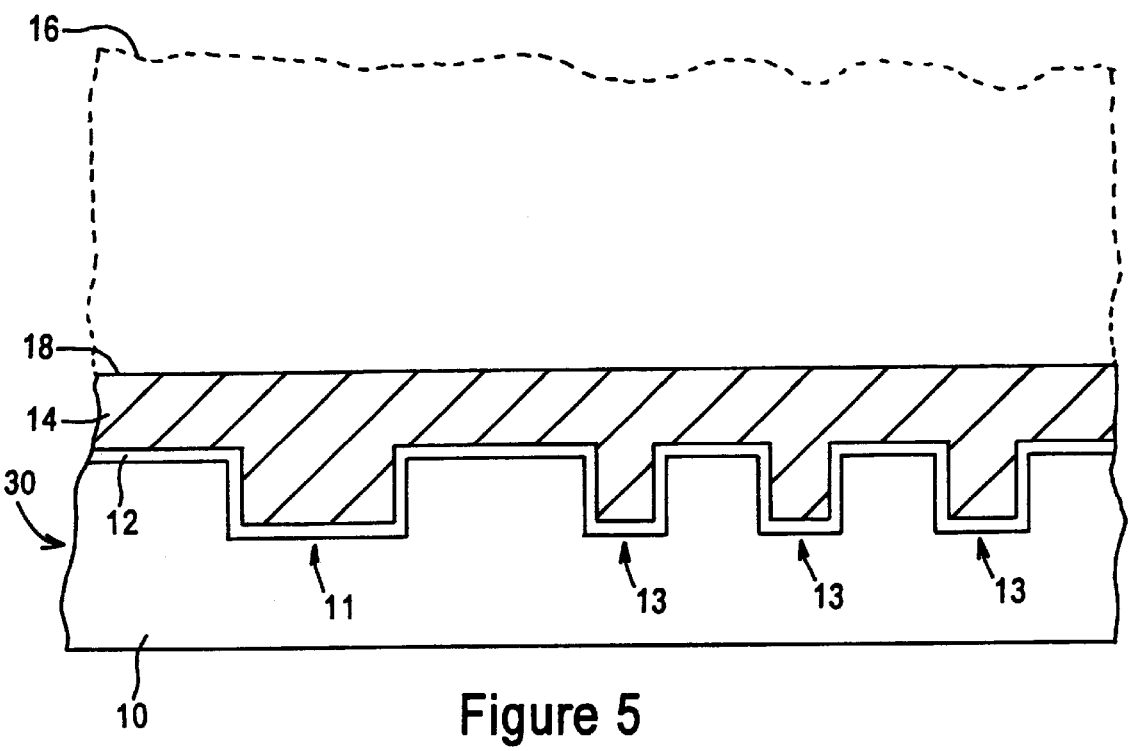
FIG. 5 is a cross-section of the portion of FIG. 3 following removal of a first amount of the copper containing conductive layer at a first, high speed rate of removal, in accordance with embodiments of the present invention.

FIG. 5 depicts the cross-section of FIG. 3 following a first phase of copper containing conductive layer removal in accordance with the present invention. The original height of the copper containing conductive layer 14 is depicted in dashed lines as reference numeral 16. During the first phase of the polishing in accordance with a method of the present invention, the wafer is pressed against the polishing pad 36 by the carrier head 31 with a pressure of between approximately 4 psi and 7 psi. The platen 34 is rotated at a speed between about 60 rpm and 150 rpm. The control of the pressure and the speed is accomplished by the control circuitry 38. The indicated pressures and rotational speeds provide a first, relatively rapid rate of removal of the copper containing conductive layer 14. This rate of removal reduces the height of the copper containing conductive layer 14 to the height indicated in FIG. 5 by the solid reference numeral 18. For example, the height of the copper containing conductive layer over the substrate 10 and the top surface with barrier layer 12 may be approximately 20% of the initial height 16 of the copper containing conductive layer 14. A figure of 20% remaining (or 80% removal) is exemplary only, as a different percentage of the copper containing conductive layer 14 may be removed in the first phase removal step. In certain preferred embodiments, the amount of removal ranges between 60% to 90% of the conductive layer 14 so that the amount that remains in the conductive layer 14 is between about 10% to about 40%. The 10% provides an adequate margin of safety to prevent dishing and pattern erosion, although it is possible that a lower margin may be used, such as 5%, as long as adequate controls are in place to prevent excessive polishing that will create dishing or pattern erosion. The amount of material removed, e.g. 80% of the initial conductive layer 14, is determined by known methods. For example, the wafer 30 may be polished for a specified amount of time at the first rate of removal, which provides an approximation of the amount of material removed.

Figure 6:
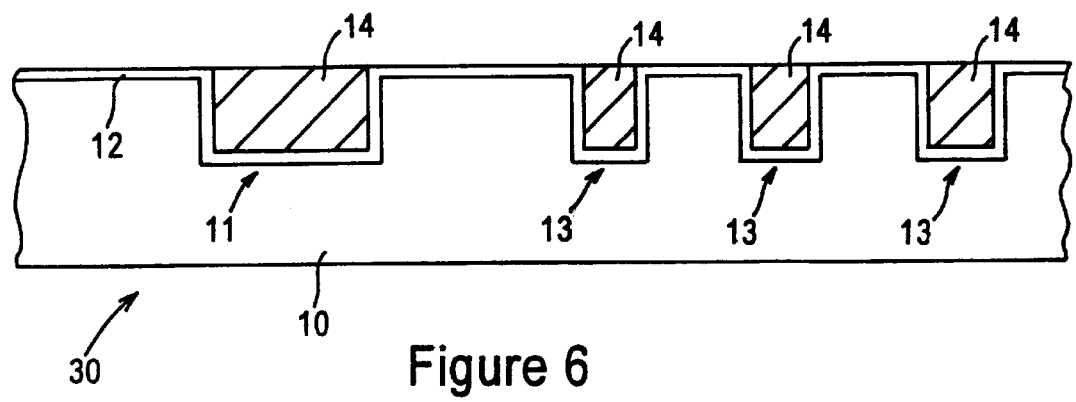
FIG. 6 is a cross-section of the portion of FIG. 5, following the CMP planarizing of the copper containing conductive layer at a second rate of removal, slower than the first rate of removal.

Once the copper containing conductive layer 14 has been produced by a first amount, such as by 80%, the second polishing step, to remove the material in the copper conductive layer 14 at a second rate of removal, which is slower than the first rate of removal, is now performed. One of the advantages of the present invention is that the same platen 34 may be used in both phases of removal, without changing polishing stations. However, in the present invention, the slower rate of removal is accomplished by applying a relatively low pressure against the semiconductor wafer 30 through the carrier head 31. Furthermore, the platen 34 is rotated at a slower speed in certain embodiments. As exemplary values, the pressure is approximately 1 psi, and the speed of rotation is approximately 40 rpm. This removes approximately 10% to 40% of the initially deposited copper conductive layer 14 that remained above the barrier layer 12 after the first polishing step. The resulting structure is depicted in FIG. 6. A planarized surface is thus achieved, while stopping on the barrier layer 12. The copper 14 within the trenches 11 and features 13 do not exhibit the dishing and pattern erosion as in the prior art depicted in FIG. 4.

The present invention maintains the high throughput required for cost efficient manufacturing, and also the uniformity of removal required for quality assurance, while avoiding producing significant dishing and erosion when the barrier layer is reached. This is accomplished by employing a multiple phase planarization technique that removes the majority of the copper layer to be polished (planarized) at a rapid rate of removal, and then polishing the remaining amount of copper conductive layer at a slower rate of removal that avoids the dishing and pattern erosion. Another advantage of the present invention is that the two rates of removal are readily provided by controlling conventional CMP planarization apparatus to operate at different speeds and pressures. Hence, large investments in new polishing apparatus are avoided, although an improvement in planarization is achieved.

Although the present invention has been described and illustrated in detail, it is to be clearly understood that the same as by way of illustration and example only and is not to be taken by way of limitation, spirit and scope of the present invention being limited only by the terms of the appended claims.

What is claimed is:

1. A method of polishing a conductive layer on an underlying layer of a semiconductor wafer, the method comprising the steps of:

polishing the conductive layer at a first rate of removal until about 60% to 90% of the conductive layer above the underlying layer is removed; and polishing the conductive layer at a second rate of removal, slower than the first rate, until the remainder of the conductive layer above the underlying layer is removed.

2. The method of claim 1, wherein the step of polishing the conductive layer at the first rate includes applying an exposed surface of the conductive layer against a polisher with a first pressure.

3. The method of claim 2, wherein the step of polishing the conductive layer at the second rate includes applying the exposed surface of the conductive layer against the polisher with a second pressure that is less than the first pressure.

4. The method of claim 3, wherein the steps of polishing the conductive layer at the first rate and at the second rate include employing the same single polishing pad to polish the conductive layer at the first rate and at the second rate.

5. The method of claim 3, wherein the first pressure is between about 4 psi and about 7 psi.

6. The method of claim 5, wherein the second pressure is between about 1 psi and about 3 psi.

7. The method of claim 6, wherein the step of polishing the conductive layer at the first rate includes rotating the polisher against the conductive layer at a first speed.

8. The method of claim 7, wherein the step of polishing the conductive layer at the second rate includes rotating the polisher against the conductive layer at a second speed that is less than the first speed.

9. The method of claim 8, wherein the first speed is between about 60 rpm and about 150 rpm during polishing of the conductive layer.

10. The method of claim 9, wherein the second speed is between about 20 rpm and about 50 rpm during polishing of the conductive layer.

11. The method of claim 10, wherein the conductive layer comprises copper or a copper alloy.

12. The method of claim 1, wherein the second amount is between about 10% to about 40% of the conductive layer.

13. The method of claim 1, wherein the conductive layer comprises copper or a copper alloy.

14. A method of planarizing a copper containing conductive layer of a semiconductor wafer, the method comprising the steps of:
patterning a substrate layer;
forming within and upon the patterned substrate layer a blanketing copper containing layer;
chemical mechanical polish (CMP) planarizing the copper containing layer at a first rate of removal until the cooper containing layer is reduced by approximately 60% to 90% to a first desired thickness above the substrate layer; and
CMP planarizing the copper containing layer at a second rate of removal, slower than the first rate of removal, until substantially all of the copper containing layer above the substrate layer is removed.

15. The method of claim 14, wherein the substrate layer includes a barrier layer on which the copper containing layer is formed.

16. The method of claim 15, wherein the step of polishing the conductive layer at the first rate includes rotating the polisher against the conductive layer at a first speed.

17. The method of claim 16, wherein the step of polishing the conductive layer at the second rate includes rotating the polisher against the copper containing layer at a second speed that is less than the first speed.

18. The method of claim 17, wherein the first speed is between about 60 rpm and about 150 rpm.

19. The method of claim 18, wherein the second speed is between 20 rpm and about 50 rpm.

20. The method of claim 15, wherein the step of CMP planarizing at a first rate of removal includes applying a polisher against a top surface of the copper containing layer with a first pressure.

21. The method of claim 20, wherein the step of CMP planarizing at a second rate of removal includes applying the polisher against the top surface of the copper containing layer with a second pressure that is less than the first pressure.

22. The method of claim 21, wherein the steps of polishing the conductive layer at the first rate and at the second rate include employing the same single polishing pad to polish the conductive layer at the first rate and at the second rate.

23. The method of claim 21, wherein the first pressure is between about 4 psi and about 7 psi.

24. The method of claim 23, wherein the second pressure is between about 1 psi and about 3 psi.

25. The method of claim 24, wherein the step of polishing the conductive layer at the first rate includes rotating the polisher against the conductive layer at a first speed.

26. The method of claim 25, wherein the step of polishing the conductive layer at the second rate includes rotating the polisher against the copper containing layer at a second speed that is less than the first speed.

27. The method of claim 26, wherein the first speed is between about 60 rpm and about 150 rpm.

28. The method of claim 27, wherein the second speed is between about 20 rpm and about 50 rpm.

* * * * *